(12) United States Patent
Wang et al.

(10) Patent No.: US 8,872,312 B2
(45) Date of Patent: Oct. 28, 2014

(54) EMI PACKAGE AND METHOD FOR MAKING SAME

(75) Inventors: Chuei-Tang Wang, Taichung (TW); Der-Chyang Yeh, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 110 days.

(21) Appl. No.: 13/250,697

(22) Filed: Sep. 30, 2011

(65) Prior Publication Data
US 2013/0082364 A1    Apr. 4, 2013

(51) Int. Cl.
| | | |
|---|---|---|
| *H01L 23/552* | (2006.01) | |
| *H01L 29/04* | (2006.01) | |
| *H01L 29/82* | (2006.01) | |
| *H01L 23/48* | (2006.01) | |
| *H01L 23/02* | (2006.01) | |
| *H01L 21/00* | (2006.01) | |
| *H01L 21/56* | (2006.01) | |
| *H01L 23/31* | (2006.01) | |
| *H01L 25/065* | (2006.01) | |
| *H05K 3/28* | (2006.01) | |
| *H01L 23/00* | (2006.01) | |

(52) U.S. Cl.
CPC .......... *H01L 23/3128* (2013.01); *H01L 21/565* (2013.01); *H01L 2224/13147* (2013.01); *H05K 2203/1316* (2013.01); *H01L 24/16* (2013.01); *H05K 221/0715* (2013.01); *H01L 2224/81191* (2013.01); *H05K 2201/09972* (2013.01); *H01L 2224/131* (2013.01); *H01L 2224/16145* (2013.01); *H01L 2924/15311* (2013.01); *H01L 25/0655* (2013.01); *H05K 3/284* (2013.01); *H01L 2224/16235* (2013.01); *H01L 23/552* (2013.01); *H05K 2201/10378* (2013.01); *H01L 2224/16225* (2013.01)

USPC ............. 257/659; 257/53; 257/421; 257/690; 257/686; 257/777; 438/108; 438/127; 438/124

(58) Field of Classification Search
CPC ................. H01L 2924/00014; H01L 2924/00; H01L 2224/73265; H01L 2224/32225; H01L 2224/48227; H01L 2224/48091; H01L 2224/16225; H01L 2224/97; H01L 2924/15311; H01L 2924/00012; H01L 2924/01079; H01L 2924/13091
USPC ............. 257/53, 690, 686, 777, 660, E23.019, 257/421–427, 659, 737, 774, 698, 773, 778, 257/E21.502; 438/108, 127, 124; 361/760
See application file for complete search history.

(56) References Cited

U.S. PATENT DOCUMENTS

| | | |
|---|---|---|
| 4,811,082 A | 3/1989 | Jacobs et al. |
| 6,002,177 A | 12/1999 | Gaynes et al. |

(Continued)

*Primary Examiner* — Shaun Campbell
*Assistant Examiner* — Thai T Vuong
(74) *Attorney, Agent, or Firm* — Slater & Matsil, L.L.P.

(57) ABSTRACT

An integrated circuit structure includes a substrate, a photosensitive molding on a first side of the substrate, a via formed in the molding, and a conformable metallic layer deposited over the first side of the substrate and in the via. A through via may be formed through the substrate aligned with the via in the molding with an electrically conductive liner deposited in the through via in electrical contact with the conformable metallic layer. The integrated circuit structure may further include a connector element such as a solder ball on an end of the through via on a second side of the substrate opposite the first side. The integrated circuit structure may further include a die on the first side of the substrate in electrical contact with another through via or with a redistribution layer.

20 Claims, 13 Drawing Sheets

(56) References Cited

U.S. PATENT DOCUMENTS

| | | |
|---|---|---|
| 6,187,678 B1 | 2/2001 | Gaynes et al. |
| 6,229,216 B1 | 5/2001 | Ma et al. |
| 6,236,115 B1 | 5/2001 | Gaynes et al. |
| 6,355,501 B1 | 3/2002 | Fung et al. |
| 6,461,895 B1 | 10/2002 | Liang et al. |
| 6,562,653 B1 | 5/2003 | Ma et al. |
| 6,607,938 B2 * | 8/2003 | Kwon et al. ............. 438/109 |
| 6,762,076 B2 | 7/2004 | Kim et al. |
| 6,908,785 B2 | 6/2005 | Kim |
| 6,943,067 B2 | 9/2005 | Greenlaw |
| 7,157,787 B2 | 1/2007 | Kim et al. |
| 7,410,884 B2 | 8/2008 | Ramanathan et al. |
| 7,432,586 B2 * | 10/2008 | Zhao et al. ............. 257/685 |
| 7,531,890 B2 * | 5/2009 | Kim ............................ 257/621 |
| 7,566,590 B2 * | 7/2009 | Zhong et al. ............. 438/119 |
| 7,633,765 B1 * | 12/2009 | Scanlan et al. ............. 361/760 |
| 8,378,480 B2 * | 2/2013 | Chen et al. ............. 257/704 |
| 8,426,961 B2 * | 4/2013 | Shih et al. ............. 257/698 |
| 8,455,995 B2 * | 6/2013 | Tsai et al. ............. 257/698 |
| 2008/0142941 A1 * | 6/2008 | Yew et al. ............. 257/686 |
| 2008/0251940 A1 * | 10/2008 | Lee et al. ............. 257/777 |
| 2008/0315375 A1 * | 12/2008 | Eichelberger et al. ........ 257/659 |
| 2009/0278244 A1 * | 11/2009 | Dunne et al. ............. 257/676 |
| 2010/0032815 A1 * | 2/2010 | An et al. ............. 257/660 |
| 2010/0140779 A1 * | 6/2010 | Lin et al. ............. 257/690 |
| 2011/0031634 A1 * | 2/2011 | Pagaila ............. 257/777 |
| 2011/0223721 A1 * | 9/2011 | Cho et al. ............. 438/127 |
| 2011/0298109 A1 * | 12/2011 | Pagaila et al. ............. 257/660 |
| 2012/0286407 A1 * | 11/2012 | Choi et al. ............. 257/670 |

* cited by examiner

EMI PACKAGE AND METHOD FOR MAKING SAME

BACKGROUND

With evolving semiconductor technologies, semiconductor dies are becoming increasingly smaller, and more functions are being integrated into the semiconductor dies.

Through vias, sometimes referred to herein as through-substrate vias ("TSVs"), are commonly used in three-dimensional (3D) integrated circuits. Through vias penetrate substrates, and are used to electrically interconnect features on opposite sides of the substrates.

Conventionally, the through via formation process includes etching or drilling into the substrate to form through-via openings. The through-via openings are then filled with a conductive material which is then planarized to remove excess portions, and the remaining portions of the conductive material in the substrate form the through vias. Additional metal lines and/or metal pads are then formed over and electrically connected to the through vias, for example, using damascene processes.

Traditionally, a metal piecepart in the form of a lid is placed over a portion of structures on a semiconductor die and connected to local circuit ground for EMI shielding. A form factor for such a metal lid is large and it is not suitable to produce a sufficiently miniaturized device such as for a highly integrated handheld device employed for mobile applications.

BRIEF DESCRIPTION OF THE DRAWINGS

Exemplary embodiments will be described with reference to the accompanying figures. It should be understood that the drawings are for illustrative purposes and are therefore not drawn to scale.

DETAILED DESCRIPTION

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel EMI shield for an integrated circuit structure and a method of forming the same are provided in accordance with embodiments. The novel EMI shield replaces a metal piecepart lid with a metallic layer formed on top of a photosensitive molding for the integrated circuit structure. The novel EMI shield provides a smaller form factor than a metal piecepart lid, and it is particularly beneficial for highly integrated devices such as employed for mobile applications. The EMI shield is produced with an added metallization step that may be executed after chip mounting and lithographic processing of the photosensitive molding.

The intermediate stages of manufacturing an embodiment are illustrated hereinbelow, and variations of the embodiment are then discussed. Throughout the various views and illustrative embodiments, like reference numbers are used to designate like elements.

Figure 1:
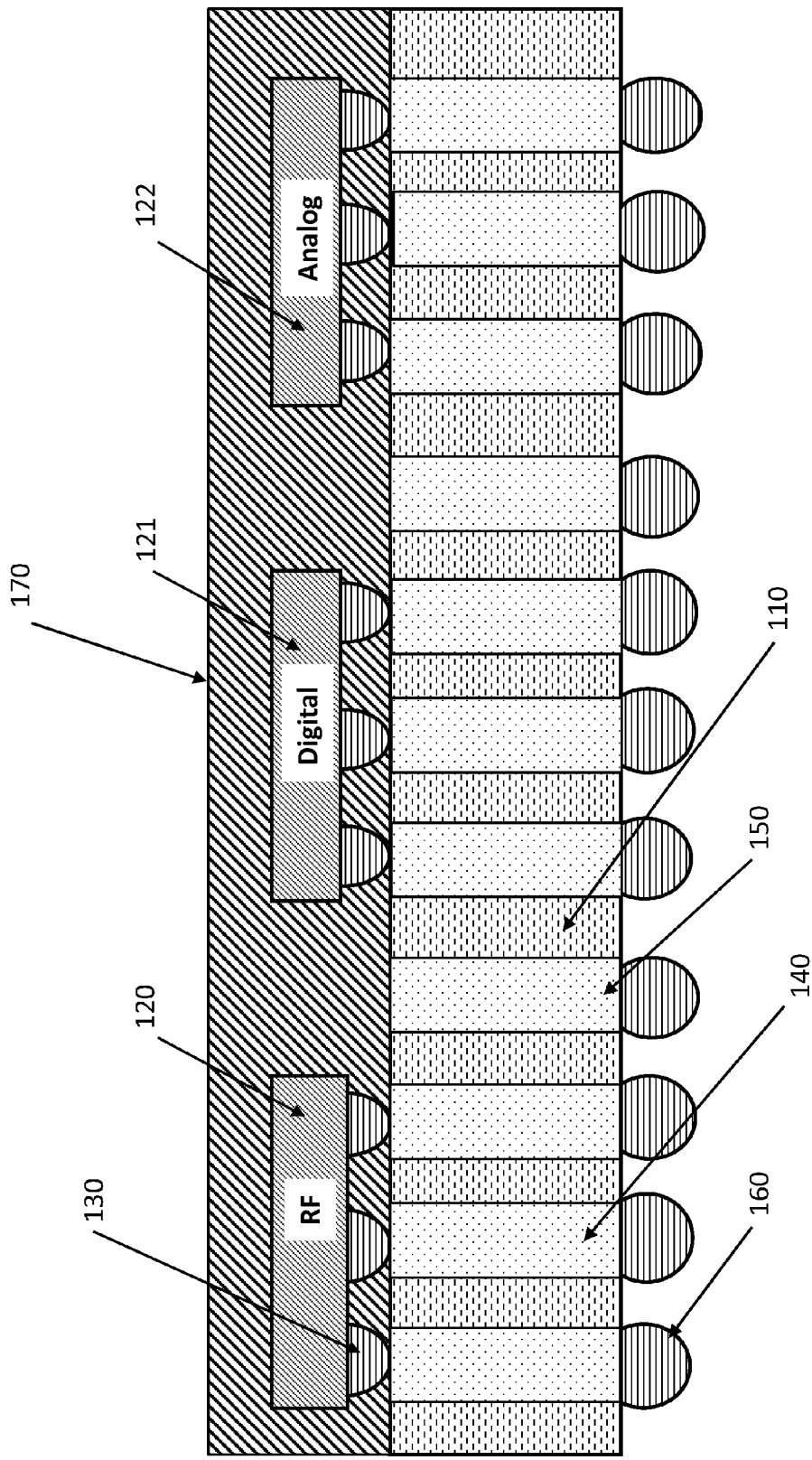
FIGS. 1, 2, and 3 illustrate elevation drawings of an integrated circuit structure in a sequence of processing steps according to various aspects of the present disclosure.

Referring initially to FIG. 1, illustrated is an elevation drawing of an illustrative embodiment of an integrated circuit structure after initial processing steps.

Interposer 110 is provided. Interposer 110 may be a silicon interposer or a semiconductor substrate formed, without limitation, of silicon, silicon germanium, silicon carbide, or even gallium arsenide or other commonly used semiconductor materials. Examples of device structures that may be formed in a semiconductor substrate include active devices such as transistors, and passive devices such as resistors, capacitors, inductors, and varactors, which may be interconnected through an interconnect layer to additional integrated circuits. Thus, interposer 110 may comprise an integrated circuit ("IC"). Interposer 110 may be formed of a dielectric material such as silicon oxide. Alternatively, interposer 110 may be free from active devices, and may include, or may be free from, passive devices.

Through vias, such as TSV 140, are formed through interposer 110 and backfilled with conductive material, such as a metallic layer electroplated onto internal surfaces of the through vias, or solder deposited into the through vias, or a metallic film sputtered into the through vias or deposited by chemical-vapor deposition. One or more dies, such as RF die 120, digital die 121, and analog die 122, that may be formed, without limitation, of silicon, positioned on a top side of interposer 110 are electrically "flip-chip" connected by connecting elements such as solder balls, for example by a reflow operation, to the through vias, such as by solder ball 130. Other connecting elements can generally be used in place of solder balls, such as solder bumps or copper pillars. The through vias such as TSV 140 provide signal, power, and ground connections to the dies 120, 121, and 122. Additional through vias, such as TSV 150, are formed in interposer 110 but are not coupled to the dies.

In an exemplary embodiment, a metallic layer or film deposited by chemical-vapor deposition is produced by introducing a copper metallic precursor, including a tantalum nitride ("TaN") barrier layer underneath, in a chamber at a pressure of a few tens of Torrs, at a temperature of 290 C or less.

A molding 170 is deposited over the dies that are positioned on the top side of interposer 110. In an exemplary embodiment, the molding 170 is a photosensitive molding such as photodefinable polybenzoxazole ("PBO") or other types. Connecting elements such as solder ball 160 are deposited on a lower side of interposer 110 opposite the top side thereof, each solder ball in electrical contact with a respective through via to provide a mechanism to electrically connect the integrated circuit structure to another component such as a leadframe or a printed wiring board. Other connecting elements could be used, such as solder bumps, copper pillars, and the like, generally referred to herein as connecting elements.

Figure 2:
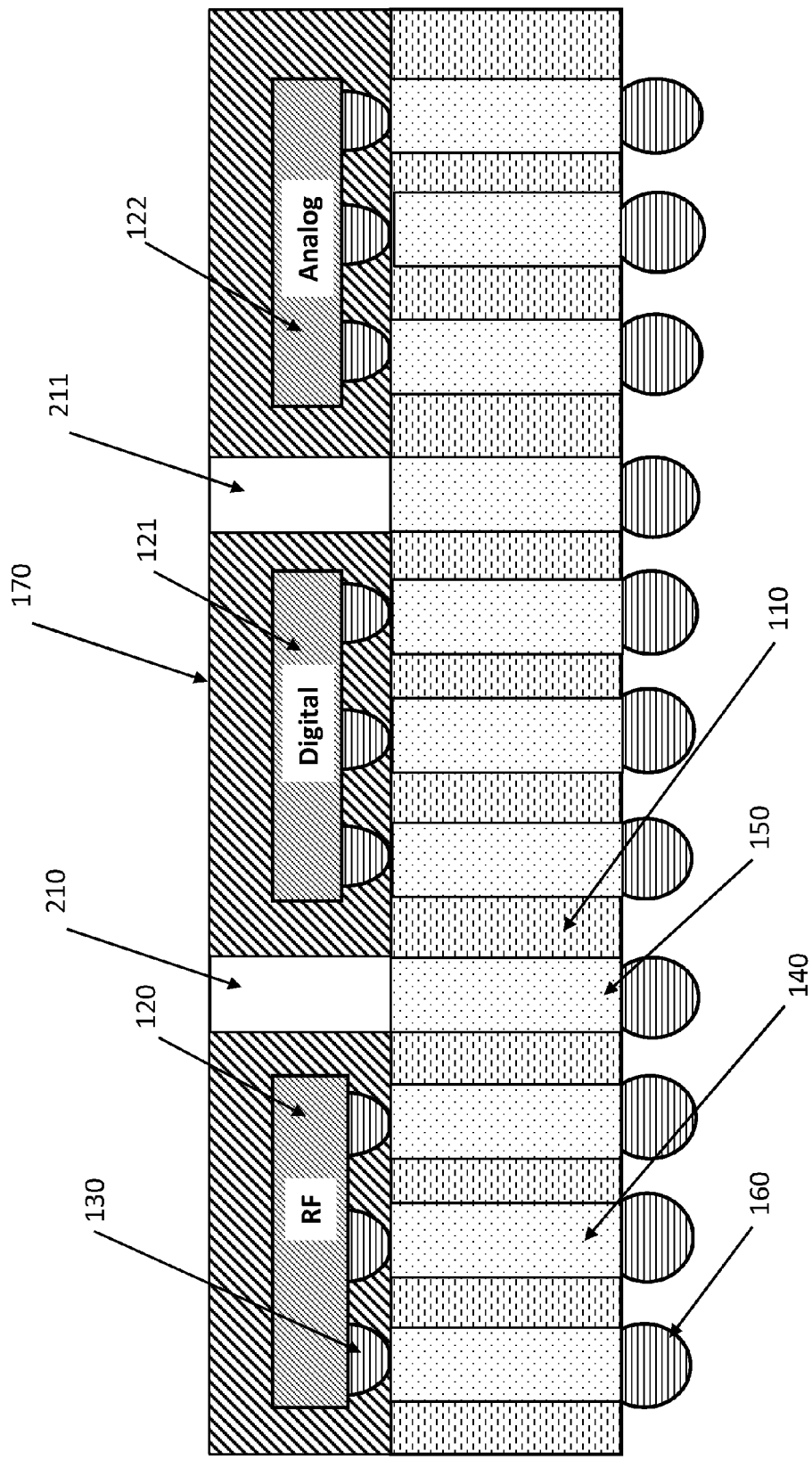

Turning now to FIG. 2, illustrated is an elevation drawing of the integrated circuit structure shown in FIG. 1 after further processing steps, constructed according to an illustrative embodiment. In an illustrative embodiment, the molding is photosensitive and is processed by photolithography to produce vias 210, 211 above through vias that are not electrically connected to the dies, e.g., TSV 150. These vias not electrically connected to the dies will be employed to ground an EMI shield that will be formed in a following step to an underlying component. In an alternative embodiment, the molding 170 is not photosensitive, and the vias are produced by a laser.

Figure 3:
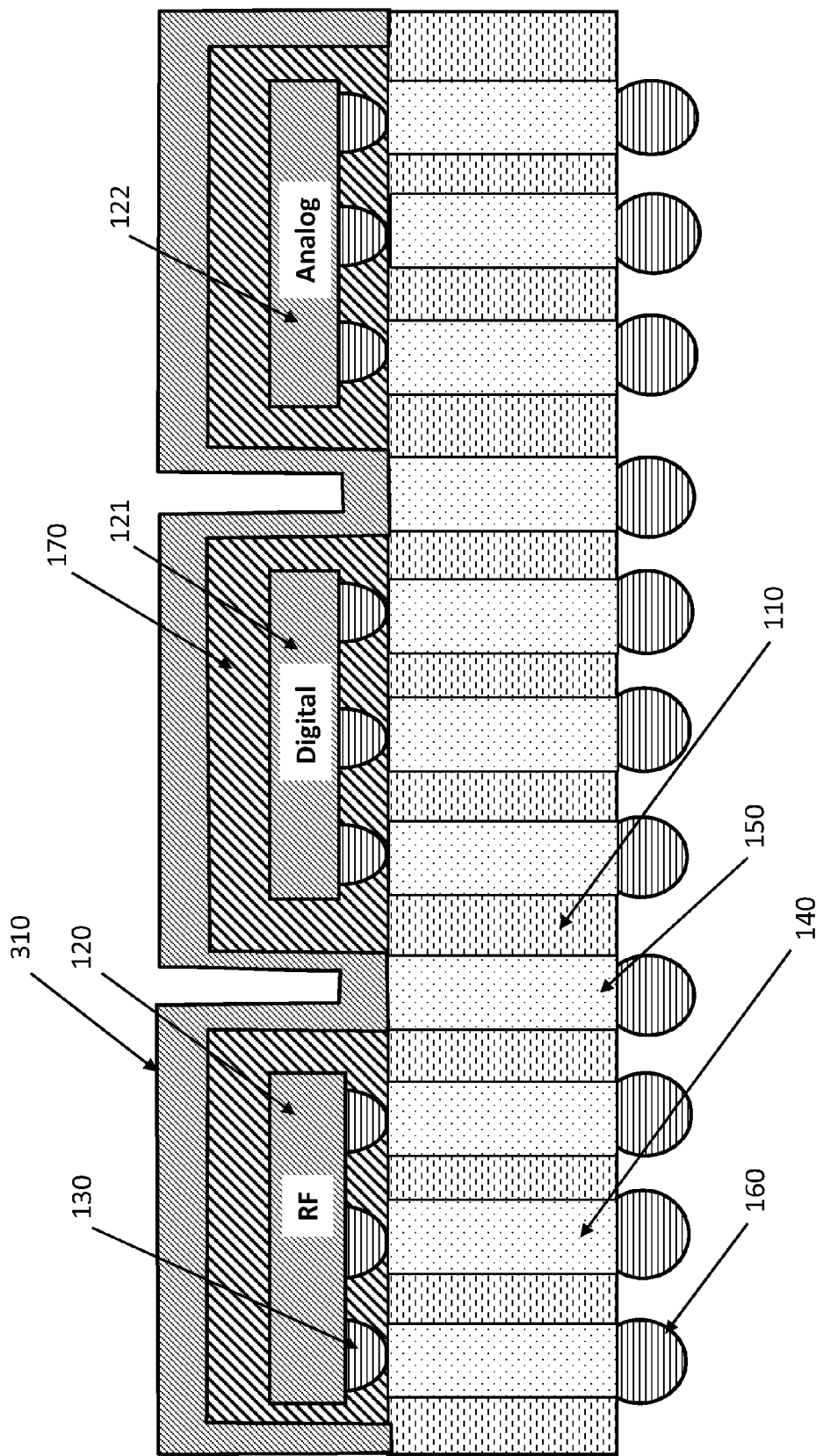

Turning now to FIG. 3, illustrated is an elevation drawing of the integrated circuit structure shown in FIG. 2 after further processing steps. A metallic layer 310 operable as an EMI shield is now conformably deposited above the molding 170. The metallic layer 310 and/or the electrically conducting material in the through vias may include aluminum, aluminum alloy, copper, copper alloy, titanium, titanium nitride, tantalum, tantalum nitride, tungsten, metal silicide, or combinations thereof, and may be deposited by an electroplating process, e.g., by electroless plating, by depositing solder over a flash coating formed on an internal surface of the through vias and/or the top side of the integrated circuit structure, or by sputtering or chemical-vapor deposition of a metallic layer/film in the through vias and/or the top side of the integrated circuit structure. An exemplary chemical-vapor deposition process that may be employed to conformably deposit a metallic layer/film above the molding 170 is described previously hereinabove. The metallic layer 310 is deposited and formed in electrical contact with through vias that may not be directly connected to the dies, such as TSV 150. An exposed surface of the molding 170 may be etched, such as with an ion etch, prior to forming the metallic layer 310 thereon to improve a bond between the molding 170 and the metallic layer 310. In an illustrative embodiment, the metallic layer 310 forms a chemical bond with the molding. In an illustrative embodiment, the metallic layer 310 forms a chemical bond with the molding without an intervening adhesive. An illustrative thickness of the metallic layer 310 in areas above the dies 120, 121, and 122 is about 10 to 15 µm. An exemplary thickness of the metallic layer on the walls of TSVs is about 5 to 8 µm. The result is a conformably formed EMI shield that can be connected to local circuit ground, advantageously having a form factor smaller than a metal piecepart which is particularly beneficial for a highly integrated circuit structure.

Figure 4:
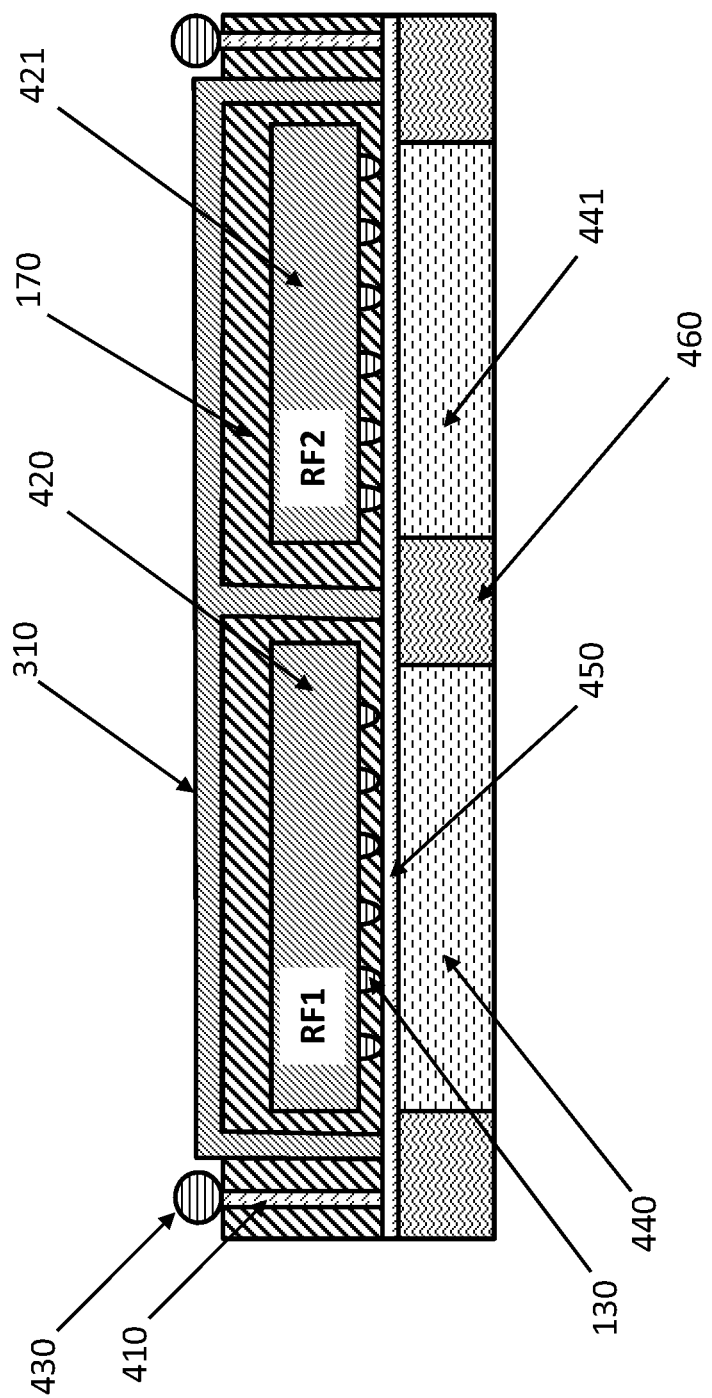
FIGS. 4 to 9 illustrate elevation drawings of illustrative embodiments of an integrated circuit structure including a metallic layer operable as an EMI shield.

Turning now to FIG. 4, illustrated is an elevation drawing of an illustrative embodiment of an integrated circuit structure including a metallic layer operable as an EMI shield. The embodiment illustrated in FIG. 4 includes a redistribution layer ("RDL") 450 that provides electrical interconnection among a plurality of dies with a multi-die fan out, such as among first RF die 420 and second RF die 421, each die positioned above a respective interposer 440, 441, such as a semiconductor substrate or a silicon IC. The interposers are mechanically secured together by molding as illustrated in FIG. 4 by molding 460 deposited between interposer 440 and interposer 441. Electrical connection of the integrated circuit structure with a leadframe or printed wiring board is provided by connecting elements such as solder ball 430 placed above and in contact with via 410 formed in molding 170. An exemplary diameter of vias formed in the molding 170 produced with photolithography is about 50 to 100 µm, and about 100 µm or more for vias formed with a laser. EMI shielding is thus provided by metallic layer 310 deposited above and in through-holes of the molding 170. Grounding of the metallic layer 310 is provided by the RDL 450 that is coupled to local circuit ground by vias, such as by via 410, and by connecting elements, such as by solder ball 430.

Figure 5:
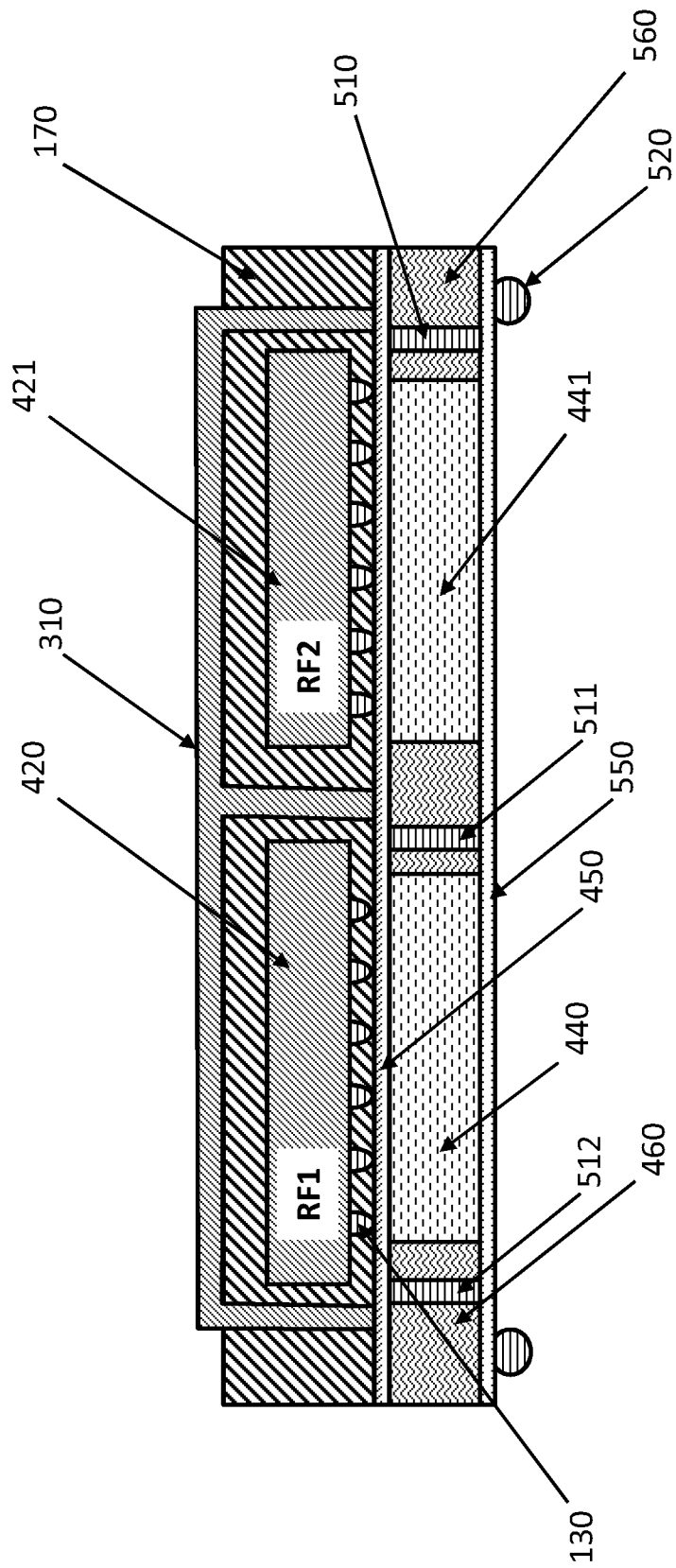

Turning now to FIG. 5, illustrated is an elevation drawing of an illustrative embodiment of integrated circuit structure including a metallic layer. The embodiment illustrated in FIG. 5 includes first RDL 450 that provides electrical interconnection with a multi-die fan out among a plurality of dies, such as first RF die 420 and second RF die 421, each die positioned above respective interposers 440, 441, such as a semiconductor substrate or a silicon IC. The embodiment illustrated in FIG. 5 includes a second RDL 550 that provides electrical connection of the first RF die 420 and the second RF die 421 and the metallic layer 310 to a component such as a leadframe or a printed wiring board. The molding 560 illustrated in FIG. 5 is a photosensitive molding that is lithographically processed to form vias therethrough, such as vias 510, 511, and 512. In an alternative embodiment, the molding 560 is not photosensitive and vias therethrough are formed with a laser. An exemplary diameter of vias in the photosensitive molding 560 formed with photolithography is about 50 to 100 µm, and about 100 µm or more for vias formed with a laser. Connection of the metallic layer 310 and RF dies 420 and 421 to the component such as a leadframe or a printed wiring board is provided by the vias 510, 511, 512 formed in the molding 560 in conjunction with connecting elements such as solder ball 520, coupled to the second RDL 550. The vias 510, 511, 512 are filled with solder that may be deposited on a flash coating in the vias, or the internal surfaces of the vias may be electroplated, e.g., by electroless plating, or may be sputtered with a conductive metallic layer/film, or may be covered with a conductive metallic layer/film formed by chemical-vapor deposition.

Figure 6:
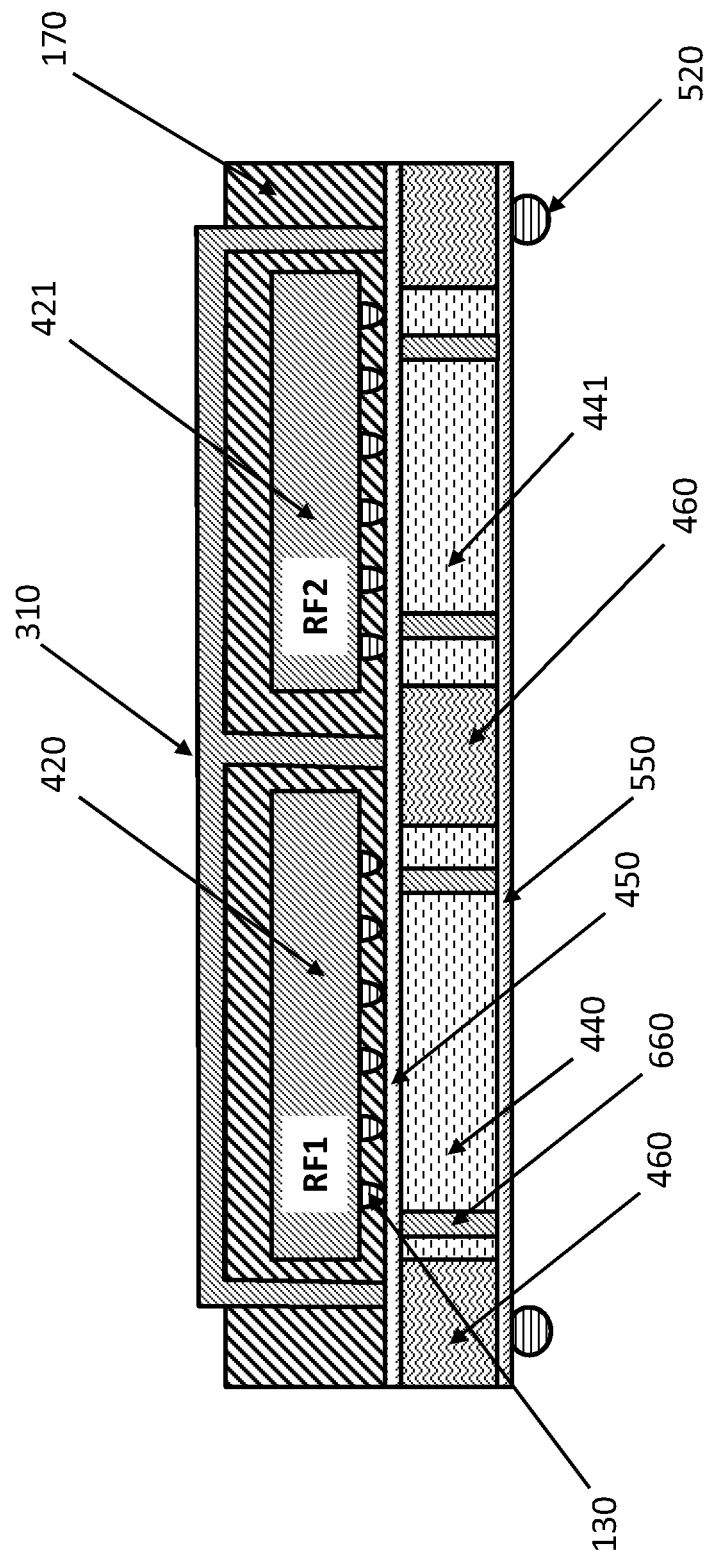

Turning now to FIG. 6, illustrated is an elevation drawing of an illustrative embodiment of integrated circuit structure including a metallic layer operable as an EMI shield. The embodiment illustrated in FIG. 6 includes first RDL 450 that provides electrical interconnection with a multi-die fan out among a plurality of dies, such as first RF die 420 and second RF die 421, each die positioned above a respective interposer 440, 441, such as a semiconductor substrate or a silicon IC. The embodiment illustrated in FIG. 6 includes the second RDL 550 that provides electrical connection of the first RF die 420 and the second RF die 421 and the metallic layer 310 to a leadframe such as a printed wiring board. The molding 460 illustrated in FIG. 6 need not be a photosensitive molding to form vias therethrough. Vias are formed through the interposers 440, 441, which vias, such as via 660, are filled with solder that may be deposited on a flash coating in the vias, or the internal surface of the vias may be electroplated, e.g., by electroless plating, or may be sputtered with a conductive metallic layer/film, or the internal surface may be formed with a conductive metallic layer/film deposited by chemical-vapor deposition. Connection of the metal shield 310 and RF dies 420 and 421 to the leadframe is provided by the first RDL 450 and the second RDL 550 in conjunction with vias through the interposers 440, 441, such as via 660, and connecting elements, such as solder ball 520.

Figure 7:
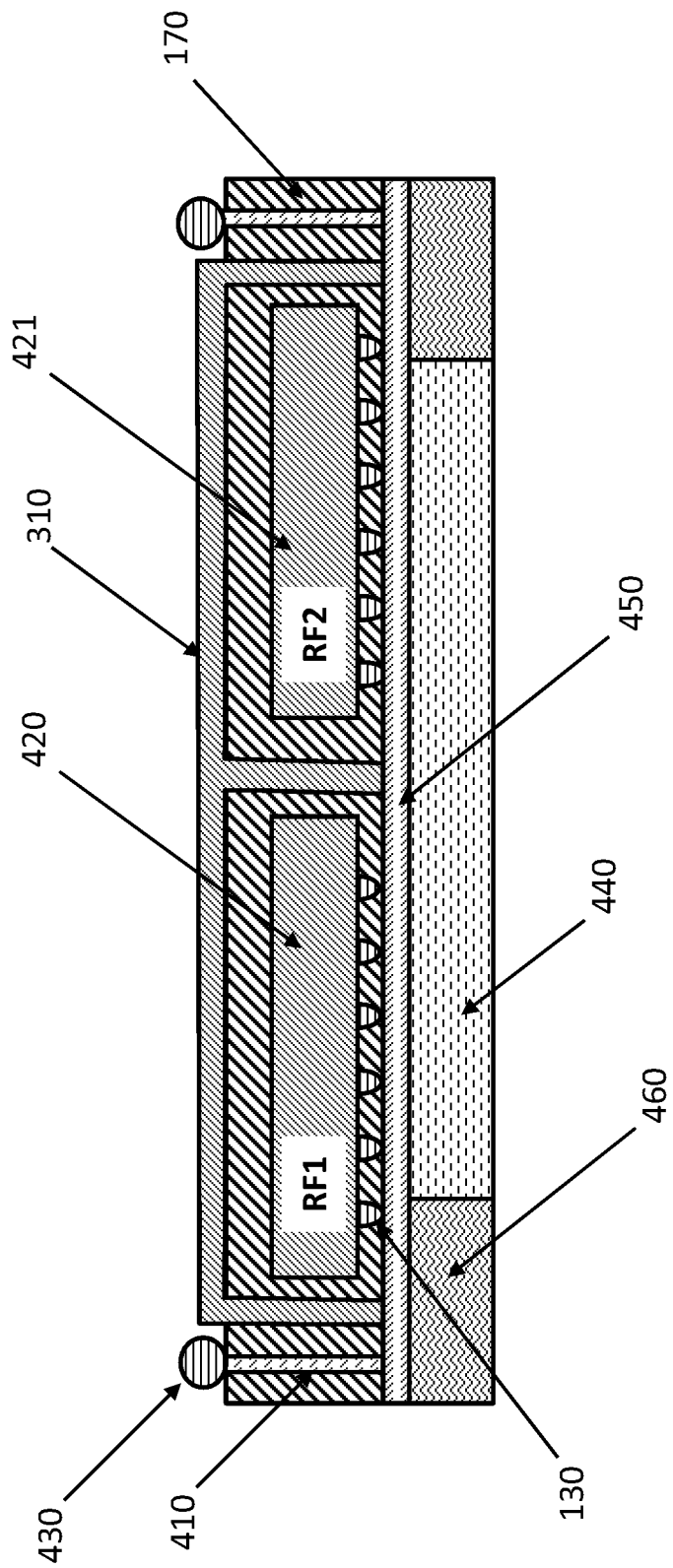

Turning now to FIG. 7, illustrated is an elevation drawing of an illustrative embodiment of integrated circuit structure including a metallic layer operable as an EMI shield. The embodiment illustrated in FIG. 7 includes RDL 450 that provides electrical interconnection with a multi-die fan out among a plurality of dies, such as first RF die 420 and second RF die 421, each die positioned above interposer 440, such as a semiconductor substrate or a silicon IC. In the embodiment illustrated in FIG. 7, the RDL 450 provides electrical connection of the first RF die 420 and the second RF die 421 and the metallic layer 310 to a leadframe such as by way of via 410 and solder ball 430. The molding 460 illustrated in FIG. 7 need not be a photosensitive molding capable of lithographic processing to form vias therethrough. The vias through the molding 170 are filled with solder that may be deposited on a flash coating in the vias, or the internal surface of the vias may be electroplated, e.g., by electroless plating, or may be sputtered with a conductive metallic layer/film, or an internal surface of the vias may be covered with a metallic film deposited by chemical-vapor deposition.

Figure 8:
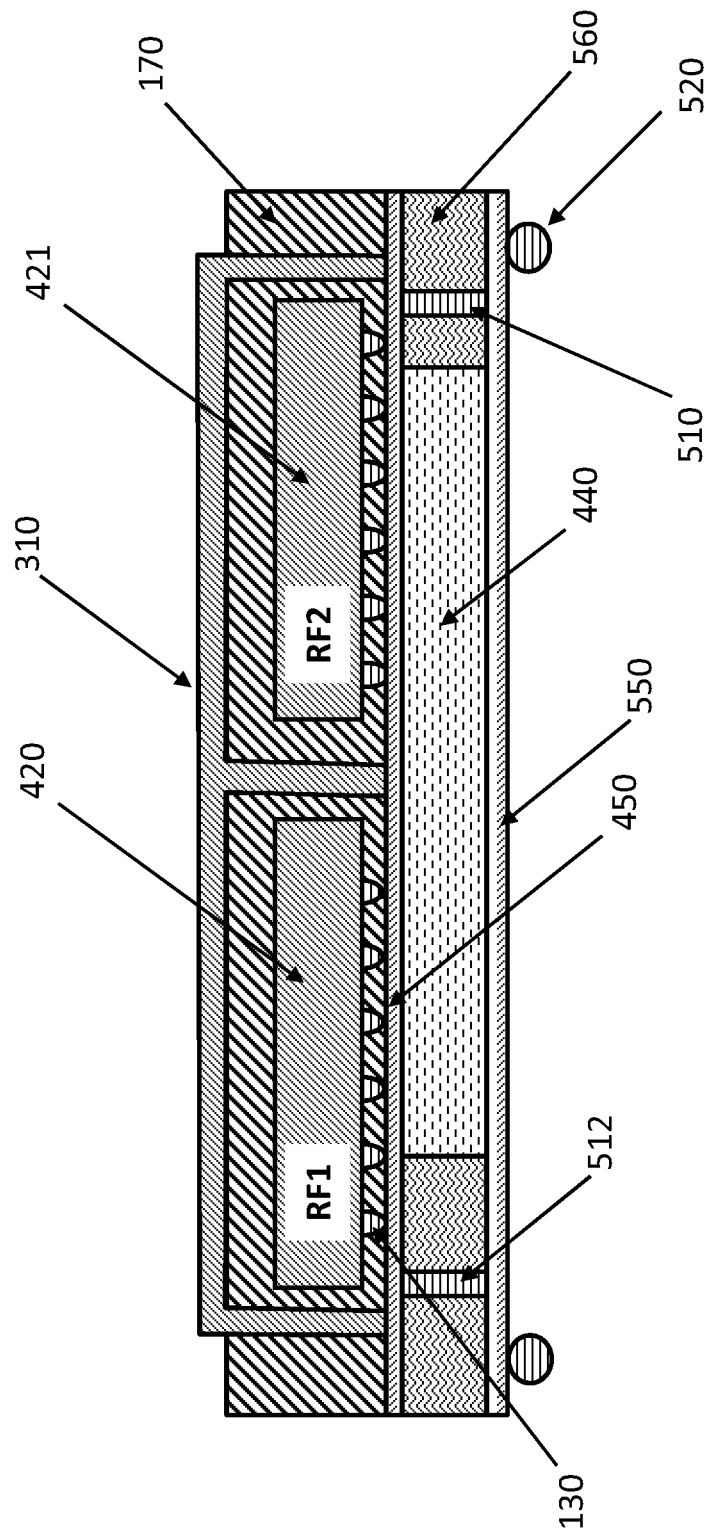

Turning now to FIG. 8, illustrated is an elevation drawing of an illustrative embodiment of integrated circuit structure including a metallic layer operable as an EMI shield. The embodiment illustrated in FIG. 8 includes first RDL 450 that provides electrical interconnection with a multi-die fan out among a plurality of dies, such as a first RF die 420 and second RF die 421, each die positioned above interposer 440, such as a semiconductor substrate or a silicon IC. The embodiment illustrated in FIG. 8 includes second RDL 550 that provides electrical connection of the first RF die 420 and the second RF die 421 and the metallic layer 310 to a leadframe such as a printed wiring board. Molding 560 is a photosensitive molding that is lithographically processed to form vias therethrough, such as vias 510, 512 that interconnect the first RDL 450 to the second RDL 550. In an alternative embodiment, molding 560 is not photosensitive and vias are formed by a laser process. The vias formed in molding 560 are filled with solder that may be deposited on a flash coating in the vias, or the internal surface of the vias may be electroplated, e.g., by electroless plating, or may be sputtered with a conductive metallic layer/film, or may be covered with a conductive metallic film deposited by chemical-vapor deposition. Connection of the metal shield 310 and RF dies 420 and 421 to the leadframe is provided by first and second RDLs, vias formed in the molding 560 in conjunction with connecting elements, such as solder ball 520 coupled to the second RDL 550.

Figure 9:
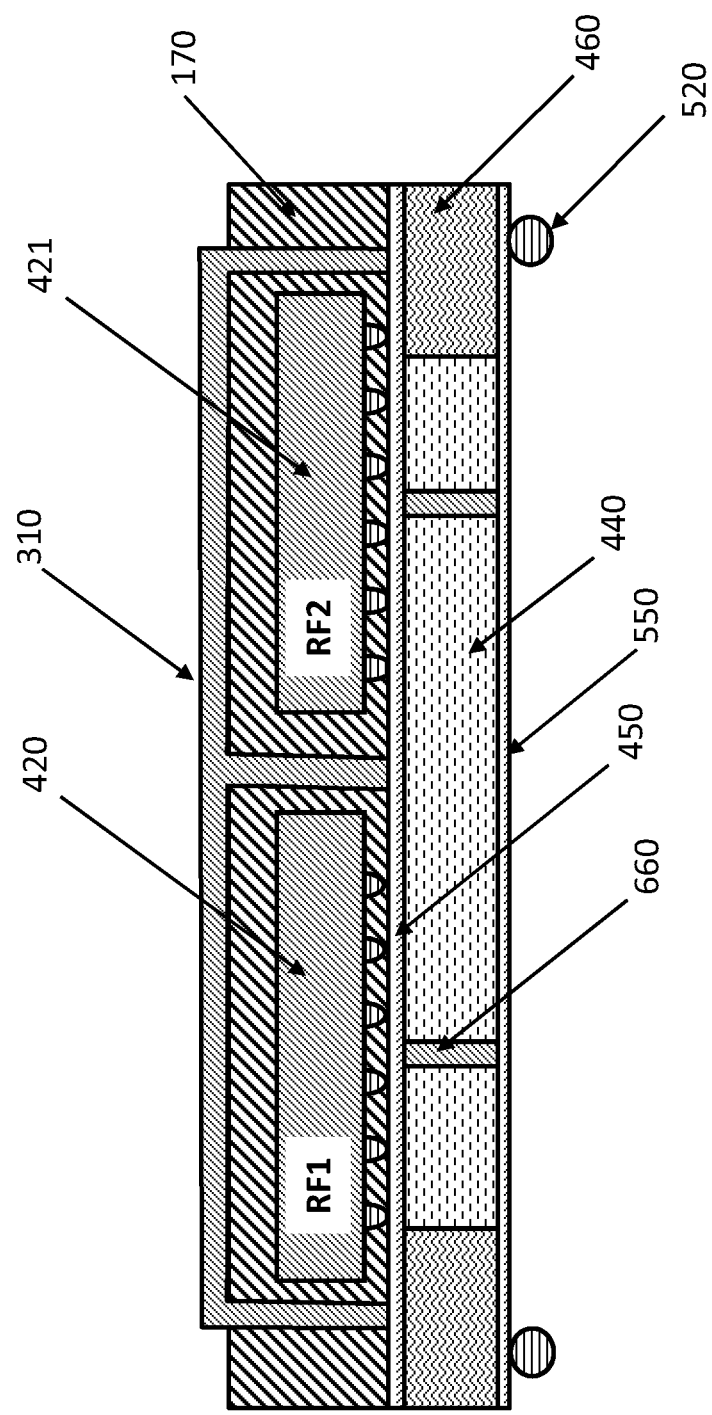

Turning now to FIG. 9, illustrated is an elevation drawing of an illustrative embodiment of integrated circuit structure including a metallic layer operable as an EMI shield. The embodiment illustrated in FIG. 9 includes first RDL 450 that provides electrical interconnection with a multi-die fan out among a plurality of dies, such as a first RF die 420 and second RF die 421, each die positioned above interposer 440, such as a semiconductor substrate or a silicon IC. The embodiment illustrated in FIG. 9 includes the second RDL 550 that provides electrical connection of the first RF die 420 and the second RF die 421 and the metallic layer 310 to a leadframe such as a printed wiring board. Molding 460 need not be a photosensitive molding. Vias are formed in interposer 440 and are filled with solder that may be deposited on a flash coating in the vias, or the internal surface of the vias may be electroplated, e.g., by electroless plating, or may be sputtered with a conductive metallic layer/film, or internal surface of the vias may be covered with a conductive metallic film deposited by chemical-vapor deposition. Connection of the metallic layer 310 and RF dies 420 and 421 to the leadframe is provided by first and second RDLs, vias formed in the interposer 440 in conjunction with connecting elements, such as solder ball 520 coupled to the second RDL 550.

Figure 10:
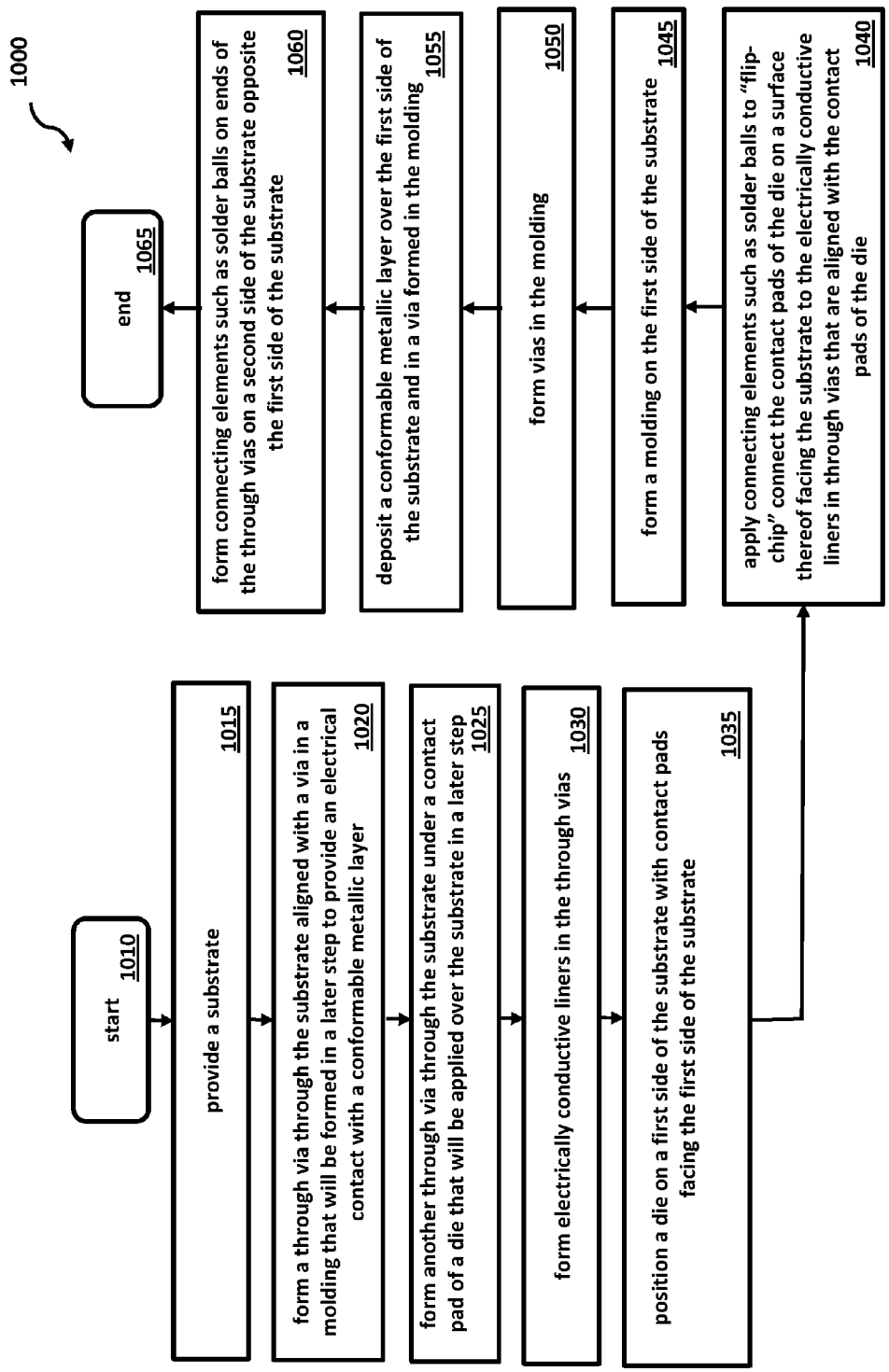
FIGS. 10 to 13, illustrate flowcharts of methods for fabricating integrated circuit structures with a conformable metallic layer operable as an EMI shield according to various aspects of the present disclosure.

Referring now to FIG. 10, illustrated is a method 1000 for fabricating an integrated circuit structure with a conformably formed metallic layer operable as an EMI shield. The method starts at block 1010. At block 1015, a substrate such as a semiconductor substrate is provided. A semiconductor substrate may include active devices such as transistors, and passive devices such as resistors, capacitors, inductors, and varactors, which may be interconnected through an interconnect layer to additional integrated circuits, as described previously hereinabove.

The method 1000 continues with block 1020 in which a through via is formed through the substrate aligned with a via in a molding that will be formed in a later step to provide an electrical contact with the conformable metallic layer.

The method 1000 continues with block 1025 in which another through via is formed through the substrate under a contact pad of a die that will be electrically connected to the substrate in a later step.

The method 1000 continues with block 1030 in which electrically conductive liners are respectively formed in the through vias. The electrically conductive liners may be formed of aluminum, aluminum alloy, copper, copper alloy, titanium, titanium nitride, tantalum, tantalum nitride, tungsten, metal silicide, or combinations thereof, and may be formed by an electroplating process, e.g., by electroless plating, by depositing solder over a flash coating formed on an internal surface of the through vias, or by sputtering or chemical-vapor deposition of a metallic layer/film in the through vias.

The method 1000 continues with block 1035 in which a die is affixed on a first side of the substrate with contact pads facing the first side of the substrate.

The method continues with block 1040 in which connecting elements such as solder balls are applied to connect the contact pads of the die on the surface thereof facing the substrate employing a flip-chip structure to the electrically conductive the liners in the through vias that are aligned with the contact pads of the die. Other connecting elements can be used in place of the solder balls, such as solder bumps or copper pillars.

The method continues with block 1045 in which a molding is formed on a first side of the substrate.

The method continues with block 1050 in which vias are formed in the molding formed on the first side of the substrate. In an illustrative embodiment, the molding formed in block 1045 is a photosensitive molding to enable the vias to be formed therethrough by a lithographic process. In an alternative embodiment, the molding formed in block 1045 is not photosensitive, but the vias are formed therethrough employing a laser technique.

The method continues with block 1055 in which a conformable metallic layer is deposited over the first side of the substrate and in a via formed in the molding. The conformable metallic layer including the material thereof deposited in the via may include aluminum, aluminum alloy, copper, copper alloy, titanium, titanium nitride, tantalum, tantalum nitride, tungsten, metal silicide, or combinations thereof, and may be deposited by an electroplating process, e.g., by electroless plating, by depositing solder over a flash coating formed on an internal surface of the via and/or the first side of the integrated circuit structure, or by sputtering or chemical-vapor deposition of a metallic layer/film in the via and/or the first side of the integrated circuit structure.

The method continues with block 1060 in which connecting elements such as solder balls, solder bumps or copper pillars are formed on ends of the through vias on a second side of the substrate opposite the first side of the substrate.

The method 1000 ends at block 1065, thereby fabricating an embodiment of an integrated circuit structure with a conformably formed metallic layer operable as an EMI shield.

Figure 11:
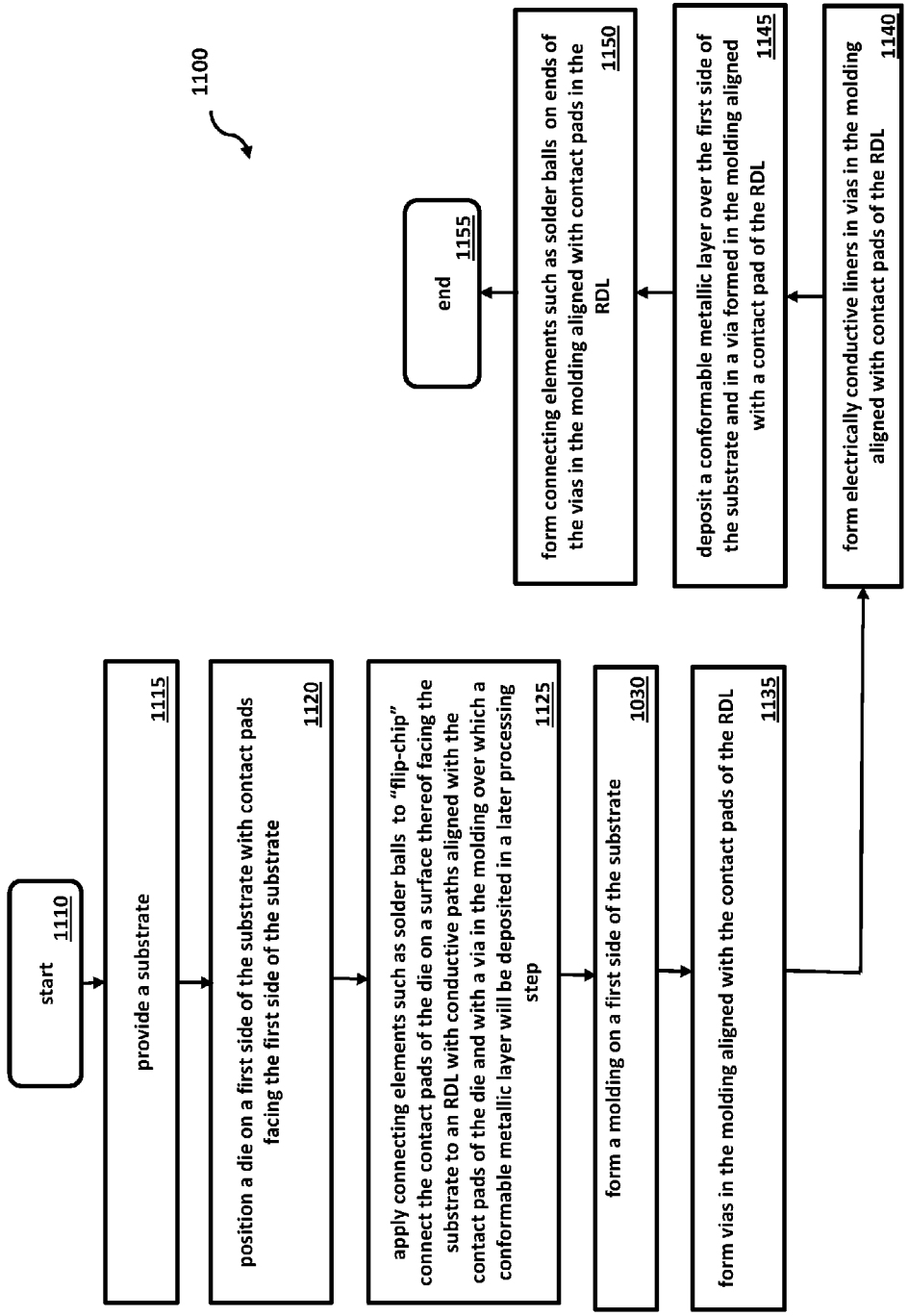

Referring now to FIG. 11, illustrated is a further method 1100 for fabricating an integrated circuit structure with a conformably formed metallic layer operable as an EMI shield. The method starts at block 1110. At block 1115, a substrate such as a semiconductor substrate is provided.

At block 1120, a die is positioned on a first side of the substrate with contact pad's facing the first side of the substrate.

At block 1125 connecting elements such as solder balls are applied to connect the contact pad of the die on the surface thereof facing the substrate, employing a flip-chip technique, to an RDL with conductive paths aligned with the contact pad the die and with a via in the molding over which a conformable metallic layer will be deposited innovator processing step.

At block 1130, a molding is formed on a first side of the substrate.

At block 1135, vias are formed in the molding aligned with the contact pad of the RDL.

At block 1140, electrically conductive liners are formed in vias in the molding aligned with contact pad of the RDL.

At block 1145, a conformable metallic layer is deposited over the first side of the substrate and in a via formed in the molding aligned with the contact pad of the RDL.

At block 1150 connecting elements such as solder balls, solder bumps or copper pillars are formed on ends of the vias in the molding aligned with contact pad in the RDL.

The method 1100 ends at block 1165, thereby fabricating an embodiment of an integrated circuit structure with a conformably formed metallic layer operable as an EMI shield.

Figure 12:
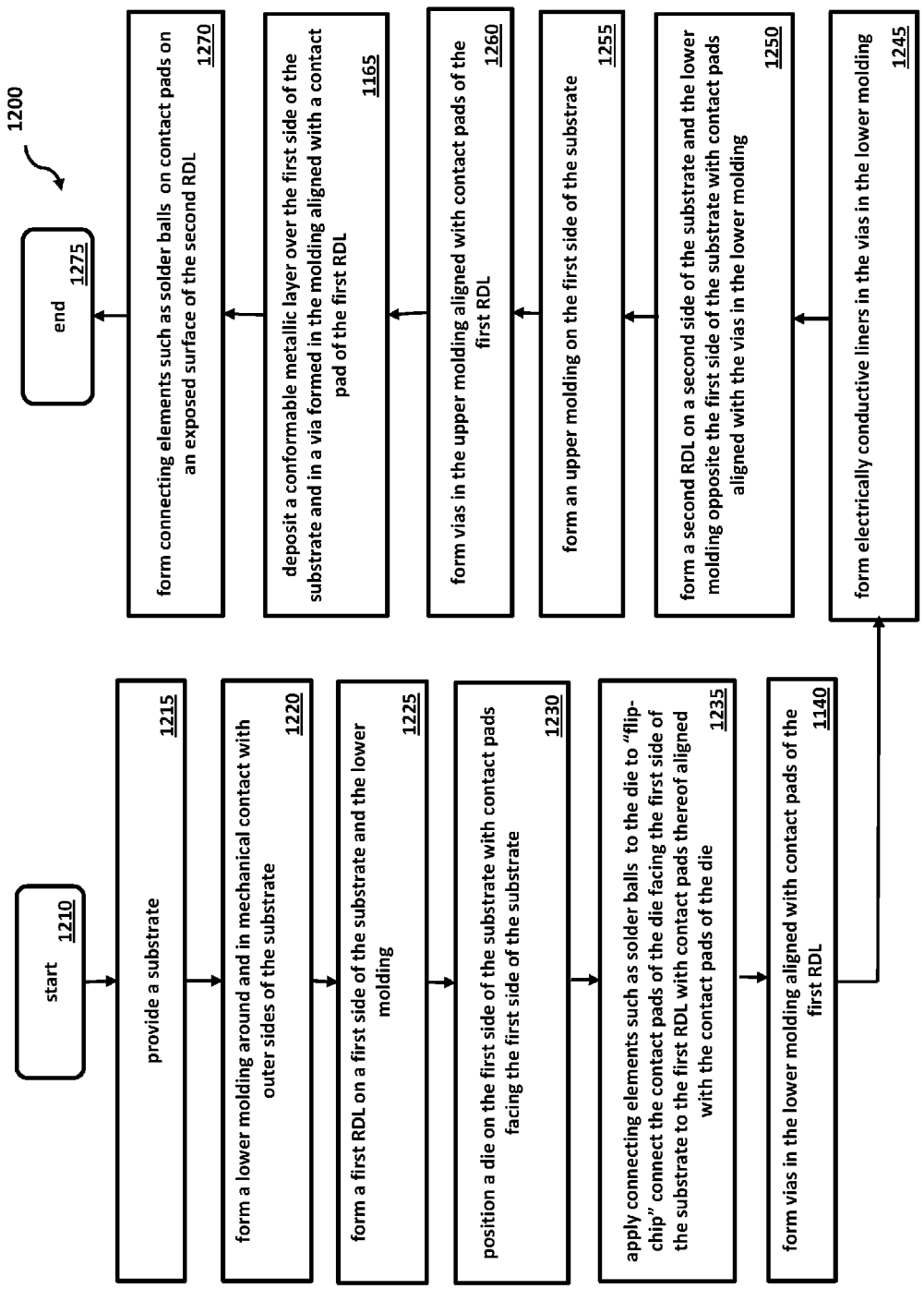

Referring now to FIG. 12, illustrated is a further method 1200 for fabricating an integrated circuit structure with a conformably formed metallic layer operable as an EMI shield. The method starts at block 1210. At block 1215, a substrate such as a semiconductor substrate is provided.

At block 1220, a lower molding is formed around and in mechanical contact with outer sides of the substrate.

At block 1225, a first RDL is formed on a first side of the substrate and the lower molding.

At block 1230, a die is affixed on the first side of the substrate with contact pads facing the first side of the substrate.

At block 1235, connecting elements such as solder balls, solder bumps or copper pillars are applied to the die, for example employing a flip-chip technique, to connect the contact pad the die facing the first side of the substrate to the first RDL with contact pads thereof aligned with the contact pad the die.

At block 1240, vias are formed in the lower molding aligned with contact pads of the first RDL. In an illustrative embodiment, the lower molding formed in block 1220 is a photosensitive molding to enable the vias to be formed therethrough by a lithographic process. In an alternative embodiment, the lower molding formed in block 1220 is not photosensitive, and the vias are formed therethrough employing a laser technique.

At block 1245, electrically conductive liners are formed in the vias in the lower molding employing techniques previously described hereinabove.

At block 1250 a second RDL is formed on a second side of the substrate and in the lower molding opposite the first side of the substrate with contact pads aligned with the respective vias in the lower molding.

At block 1255 and upper molding is formed on the first side of the substrate. The upper molding may be a photosensitive molding or it may not be and processed employing a laser technique, as described previously hereinabove.

At block 1260, vias are formed in the upper molding aligned with contact pads of the first RDL.

At block 1265 a conformable metallic layer is deposited over the first side of the substrate and in a via formed in the molding aligned with the contact pad of the first RDL.

At block 1270, connecting elements such as solder balls, solder bumps or copper pillars are formed on contact pads on an exposed surface of the second RDL.

The method 1200 ends at block 1275, thereby fabricating an embodiment of an integrated circuit structure with a conformably formed metallic layer operable as an EMI shield.

Figure 13:
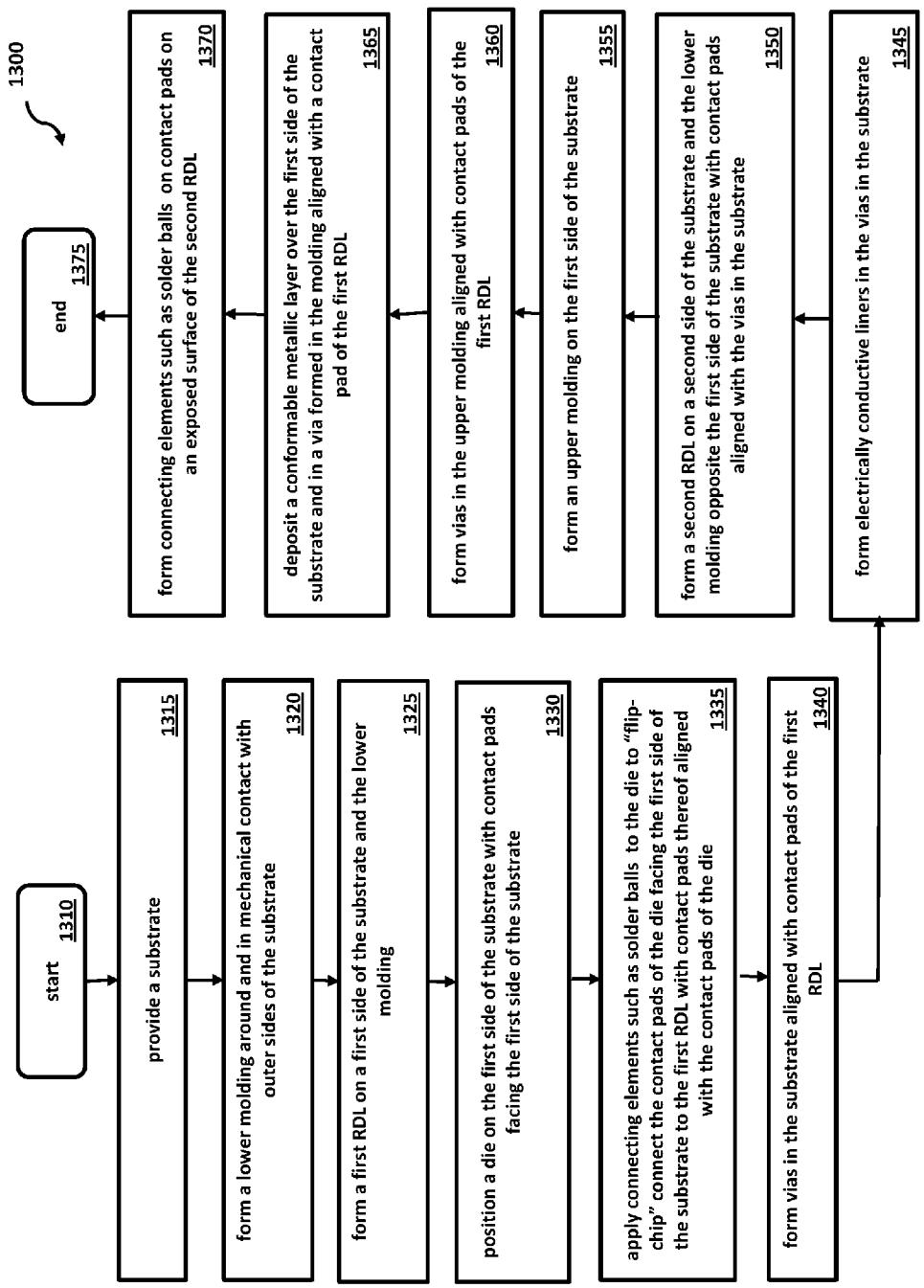

Referring now to FIG. 13, illustrated is a method 1300 for fabricating an integrated circuit structure with a conformably formed metallic layer operable as an EMI shield. The method starts at block 1310. At block 1315, a substrate such as a semiconductor substrate is provided.

At block 1320, a lower molding is formed around and in mechanical contact with outer sides of the substrate.

At block 1325, a first RDL is formed on a first side of the substrate in the lower molding.

At block 1330, a die is affixed on the first side of the substrate with contact pads facing the first side of the substrate.

At block 1335 connecting elements such as solder balls, solder bumps or copper pillars are applied employing a flip-chip technique to the die to connect the contact pad the die facing the first side of the substrate to the first RDL with contact patch thereof aligned with the contact pad the die.

At block 1340, vias are formed in the substrate aligned with contact pad of the first RDL.

At block 1345 electrically conductive liners are formed in the vias in the substrate, employing techniques previously described hereinabove.

At block 1350 a second RDL is formed on a second side of the substrate and the lower molding opposite the first side of the substrate with contact pads aligned with the vias in the substrate.

At block 1355 an upper molding is formed on the first side of the substrate. The upper molding may be a photosensitive molding to enable vias to be formed therethrough by a lithographic process. In an alternative embodiment, the upper molding is not photosensitive, but vias can be formed therethrough employing a laser technique.

At block 1360, vias aligned with contact pads in the first RDL are formed in the upper molding.

At block 1365, a conformable metallic layer is deposited over the first side of the substrate and in a via formed in the molding aligned with the contact pad of the first RDL.

At block 1370 connecting elements such as solder balls, solder bumps or copper pillars are formed on contact pads on an exposed surface of the second RDL.

The method 1300 ends at block 1375, thereby fabricating an embodiment of an integrated circuit structure with a conformably formed metallic layer operable as an EMI shield.

Various embodiments of the present disclosure may be used to improve previous manufacturing processes. In accordance with an embodiment, a method for manufacturing an integrated circuit structure having an EMI shield is provided. The method includes a providing a substrate. A molding is formed on a first side of the substrate. A via is formed in the molding, and a conformable metallic layer is deposited over the first side of the substrate and in the via. In an exemplary embodiment, the method further includes forming a through via through the substrate aligned with the via in the molding and forming an electrically conductive liner in the through via in electrical contact with the conformable metallic layer. In an exemplary embodiment, the step of depositing the conformable metallic layer includes at least one of electroplating, sputtering, performing chemical-vapor deposition, and depositing solder. In an exemplary embodiment, the step of forming a via in the molding includes exposing the molding to a patterned light source, and removing a portion of the molding, such as by forming the through via by a lithographic process or with a laser. In an exemplary embodiment, the method further includes positioning a die on the first side of the substrate, forming another through via through the substrate under a contact pad of the die facing the substrate, forming another electrically conductive liner in the another through via, and connecting the contact pad of the die to the another electrically conductive liner with a connector element. In an exemplary embodiment, the method further includes forming an RDL on the first side of the substrate with a conductive path in contact with the conformable metallic layer, forming another via in the molding aligned with the conductive path, forming another conductive liner in the another via, and forming another connector element on an end of the another via on a side of the molding opposite the RDL. In an exemplary embodiment, the method further includes forming an RDL on the first side of the substrate with a conductive path in contact with the conformable metallic layer, forming another molding under the RDL in mechanical contact with substrate and the RDL, forming another via in the another molding aligned with the conductive path in the RDL, forming another conductive liner in the another via, forming another RDL on a second side of the substrate opposite the first side of the substrate with another conductive path in contact with the another via, and forming another connector element on the another RDL in contact with the another conductive path. In an exemplary embodiment, the another molding is a photosensitive molding. In an exemplary embodiment, the method further includes forming an RDL on the first side of the substrate with a conductive path in contact with the conformable metallic layer, forming another via in the substrate aligned with the conductive path in the RDL, forming another conductive liner in the another via, forming another RDL on a second side of the substrate opposite the first side of the substrate with another conductive path in contact with the another via, and forming another connector element on the another RDL in contact with the another conductive path. In an exemplary embodiment, the method further includes forming an RDL on the first side of the substrate with a conductive path in contact with the conformable metallic layer, forming another via in the molding on the first side of the substrate, forming another conductive liner in the another via, and forming another connector element on the another via in contact with the another conductive liner.

Another form of the present disclosure involves an integrated circuit structure. The integrated circuit structure includes a substrate, a molding on a first side of the substrate, a via in the molding, and a conformable metallic layer over the first side of the substrate and in the via. In an exemplary embodiment, the integrated circuit structure includes a through via through the substrate aligned with the via in the molding, and an electrically conductive liner in the through via in electrical contact with the conformable metallic layer. In an exemplary embodiment, the integrated circuit structure further includes a connector element on an end of the through via on a second side of the substrate opposite the first side. In an exemplary embodiment, the molding is a photosensitive molding. In an exemplary embodiment, integrated circuit structure further includes a die on the first side of the substrate, another through via through the substrate positioned under a contact pad of the die facing the substrate, another electrically conductive liner in the another through via, and a connector element in electrical contact with the another electrically conductive liner of the another through via and the contact pad of the die. In an exemplary embodiment, the integrated circuit structure further includes an RDL on the first side of the substrate with a conductive path in contact with the conformable metallic layer, another via in the molding aligned with the conductive path, a conductive liner in the another via, and a connector element in electrical contact with an end of the another via on a side of the molding opposite the RDL. In an exemplary embodiment, the integrated circuit structure further includes an RDL on the first side of the substrate with a conductive path in contact with the conformable metallic layer, another molding under the RDL in mechanical contact with the substrate and the RDL, another via in the another molding aligned with the conductive path in the RDL, another conductive liner in the another via, another RDL on a second side of the substrate opposite the first side of the substrate with another conductive path in contact with the another via, and a connector element on the another RDL in contact with the another conductive path. In an exemplary embodiment, the conformable metallic layer includes at least one of an electroplated layer, a spluttered layer, a layer deposited by chemical-vapor deposition, and a layer of solder. In an exemplary embodiment, the integrated circuit structure further includes an RDL on the first side of the substrate with a conductive path in contact with the conformable metallic layer, another via in the substrate aligned with the conductive path in the RDL, another conductive liner in the another via, another RDL on a second side of the substrate opposite the first side of the substrate with another conductive path in contact with the another via, and a connector element in electrical contact with the another RDL in electrical contact with the another conductive path. In an exemplary embodiment, the integrated circuit structure further includes an RDL on the first side of the substrate with a conductive path in contact with the conformable metallic layer, another via in the molding on the first side of the substrate, another conductive liner in the another via, and a connector element on the another via in electrical contact with the another conductive liner.

Although exemplary embodiments have been described in detail, it should be understood that various changes, substitutions, and alterations can be made herein without departing from the spirit and scope of the disclosure. Moreover, the scope of the present application is not intended to be limited to the particular embodiments of the process, machine, manufacture, and composition of matter, means, methods, and steps described in the specification. As one of ordinary skill in the art will readily appreciate from the disclosure, processes, machines, manufacture, compositions of matter, means, methods, or steps, presently existing that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. An integrated circuit structure, comprising:
   a substrate;
   a die on a first side of the substrate;
   a molding on the first side of the substrate and over the die; and
   an uninterrupted metallic layer over the molding on the first side of the substrate, wherein the uninterrupted metallic layer extends along a first sidewall, a second sidewall, and a bottom surface of a via in the molding, wherein the uninterrupted metallic layer extends over and covers an entire top surface of the die, and wherein a first portion of the uninterrupted metallic layer on the first sidewall and a second portion of the uninterrupted metallic layer on the second sidewall are at least partially separated.

2. The integrated circuit structure of claim 1, further comprising:
   a through via through the substrate aligned with the via in the molding; and
   an electrically conductive liner in the through via in electrical contact with the metallic layer.

3. The integrated circuit structure of claim 2, further comprising a connector element on an end of the through via on a second side of the substrate opposite the first side.

4. The integrated circuit structure of claim 1 wherein the molding is a photosensitive molding.

5. The integrated circuit structure of claim 1, further comprising:
    another through via through the substrate positioned under the die;
    another electrically conductive liner in the another through via; and
    a connector element between the die and the another through via, wherein the connector element is in electrical contact with the another electrically conductive liner of the another through via and the die.

6. The integrated circuit structure of claim 1, further comprising:
    A redistribution layer (RDL) on the first side of the substrate in electrical contact with the metallic layer;
    another via in the molding in electrical contact with the metallic layer through the RDL;
    a conductive liner in the another via; and
    a connector element in electrical contact with an end of the another via on a side of the molding opposite the RDL.

7. The integrated circuit structure of claim 1, further comprising:
    A redistribution layer (RDL) on the first side of the substrate in electrical contact with the metallic layer;
    another molding under the RDL in mechanical contact with the substrate and the RDL;
    another via in the another molding in electrical contact with the metallic layer through the RDL;
    another conductive liner in the another via;
    another RDL on a second side of the substrate opposite the first side of the substrate in electrical contact with the another via; and
    a connector element on the another RDL in electrical contact with the another via through the another RDL.

8. The integrated circuit structure of claim 1 wherein the metallic layer comprises at least one selected from a group consisting of an electroplated layer, a sputtered layer, a layer deposited by chemical-vapor deposition, and a layer of solder.

9. The integrated circuit structure of claim 1, further comprising:
    a redistribution layer (RDL) on the first side of the substrate in electrical contact with the metallic layer;
    another via in the substrate in electrical contact with the metallic layer through the RDL;
    another conductive liner in the another via;
    another RDL on a second side of the substrate opposite the first side of the substrate in electrical contact with the another via; and
    a connector element in electrical contact with the another RDL in electrical contact with the another via.

10. The integrated circuit structure of claim 1, further comprising:
    a redistribution layer (RDL) on the first side of the substrate in electrical contact with the metallic layer;
    another via in the molding on the first side of the substrate;
    another conductive liner in the another via; and
    a connector element on the another via in electrical contact with the another conductive liner.

11. An integrated circuit structure comprising:
    a substrate;
    a die over a first side of the substrate;
    a molding compound covering a top surface and sidewalls of the die; and
    an uninterrupted metal shield layer covering a top surface of the molding compound, wherein the uninterrupted metal shield layer extends along sidewalls and bottom surfaces of a first opening and a second opening in the molding compound, the uninterrupted metal shield layer only partially fills the first and the second openings, and wherein the first and the second openings are disposed on opposing sides of the die.

12. The integrated circuit structure of claim 11, wherein the substrate comprises a plurality of through substrate vias (TSVs), wherein the die is electrically connected to a first subset of the plurality of TSVs, and wherein the uninterrupted metal shield layer is electrically connected to a second subset of the plurality of TSVs.

13. The integrated circuit structure of claim 12, further comprising a first plurality of connector elements on a second side of the substrate connected to the first subset of the plurality of TSVs, the second side being opposite the first side.

14. The integrated circuit structure of claim 12, further comprising a second plurality of connector elements on a second side of the substrate connected to the second subset of the plurality of TSVs, the second side being opposite the first side, wherein the second plurality of connector elements is configured to electrically connect the uninterrupted metal shield layer to a local ground circuit.

15. An integrated circuit structure comprising:
    a first and a second die;
    a first molding compound covering the first and the second dies; and
    an uninterrupted metallic layer covering a top surface and sidewalls of the first molding compound, wherein the uninterrupted metallic layer comprises:
        a first portion disposed on a first sidewall of a via in the first molding compound between the first and the second dies; and
        a second portion disposed on a second sidewall of the via, wherein the first portion and the second portion are at least partially separated.

16. The integrated circuit structure of claim 15, further comprising a redistribution layer (RDL) interconnecting the first die to the second die.

17. The integrated circuit structure of claim 16, wherein the metallic layer is electrically connected to the RDL.

18. The integrated circuit structure of claim 15, further comprising a through-via configured to electrically connect the metallic layer to a local ground circuit.

19. The integrated circuit structure of claim 15, further comprising a first substrate and a second substrate, wherein the first and the second substrates are coplanar, and wherein the first die is aligned over the first substrate and the second die is aligned over the second substrate.

20. The integrated circuit structure of claim 19, wherein the first and the second substrates are mechanically secured together with a second molding compound.

* * * * *